US006211982B1

(12) United States Patent
Goldner et al.

(10) Patent No.: US 6,211,982 B1
(45) Date of Patent: Apr. 3, 2001

(54) REMOTE SENSOR WITH WAVEGUIDE OPTICS TELEMETRY

(75) Inventors: Eric L. Goldner, Valencia; David B. Hall, La Crescenta, both of CA (US)

(73) Assignee: Litton Systems, Inc., Woodland Hills, CA (US)

( * ) Notice: Subject to any disclaimer, the term of this patent is extended or adjusted under 35 U.S.C. 154(b) by 0 days.

(21) Appl. No.: 09/124,938

(22) Filed: Jul. 29, 1998

(51) Int. Cl.[7] ..................................................... H04B 10/12
(52) U.S. Cl. ........................ 359/142; 359/168; 359/142; 359/143; 359/144; 359/110; 385/24; 324/612; 340/870.02; 340/870.03
(58) Field of Search ..................................... 359/142, 143, 359/144, 110; 385/24; 340/870.02, 870.03; 324/612

(56) References Cited

U.S. PATENT DOCUMENTS

| | | |
|---|---|---|
| 4,370,612 | 1/1983 | Puech et al. . |
| 4,577,414 | 3/1986 | Milgiori et al. . |
| 4,857,727 * | 8/1989 | Lenz et al. ............................ 250/227 |
| 4,871,223 | 10/1989 | Auracher et al. . |
| 4,899,042 | 2/1990 | Falk et al. . |
| 4,915,503 * | 4/1990 | Pavlath ................................ 356/350 |
| 4,929,830 | 5/1990 | Bonhert et al. . |
| 4,999,539 | 3/1991 | Coovert et al. . |
| 5,041,779 | 8/1991 | Hales . |
| 5,053,694 | 10/1991 | Bonhert et al. . |
| 5,060,225 * | 10/1991 | Godfrey ................................ 359/124 |
| 5,210,407 | 5/1993 | Ito et al. . |
| 5,239,401 * | 8/1993 | Olshansky ............................ 359/188 |
| 5,267,336 | 11/1993 | Sriram et al. . |
| 5,278,499 | 1/1994 | Ito et al. . |
| 5,317,929 | 6/1994 | Brown et al. . |
| 5,369,485 | 11/1994 | Hofler et al. . |
| 5,434,501 | 7/1995 | Esman et al. . |
| 5,479,094 | 12/1995 | Esman et al. . |
| 5,583,637 | 12/1996 | Tokano et al. . |
| 5,587,791 | 12/1996 | Belleville et al. . |
| 5,623,561 | 4/1997 | Hartman . |
| 5,731,579 | 3/1998 | Woods . |
| 5,987,195 * | 11/1999 | Blake ...................................... 385/12 |

OTHER PUBLICATIONS

"Two low–cost robust electro–optic hybrid current sensors capable of operation at exteremely high potential" Rev. Sci Instrum. 63 (12) Dec. 1992, Ning et al., pp. 5771–5773.
"Interrogation of a conventional current transformer by a fiber–optic interferometer" Optics Letters vol. 16, No.18, Sep. 15, 1991, Ning et al., pp. 1448–1450.

* cited by examiner

Primary Examiner—Jason Chan
Assistant Examiner—Sanjay Patel
(74) Attorney, Agent, or Firm—Lynn & Lynn

(57) ABSTRACT

A telemetry optical fiber has a first end optically coupled to a signal source/detection module. A conversion module is optically coupled to a second end of the telemetry optical fiber. The conversion module includes an interferometer having a pair of optical paths with an optical waveguide arranged to be included in each one of the optical paths. The interferometer is arranged to produce an interference pattern to indicate the phase relationship of optical signals input to the pair of optical paths from the signal source/detection module. A phase modulator is arranged to phase modulate optical signals guided by the optical waveguide. A sensor head that produces a voltage proportional to a quantity being measured is connected to the phase modulating apparatus and arranged to provide a modulating signal to the phase modulating apparatus such that the interference pattern indicates the magnitude of the measured quantity.

6 Claims, 1 Drawing Sheet

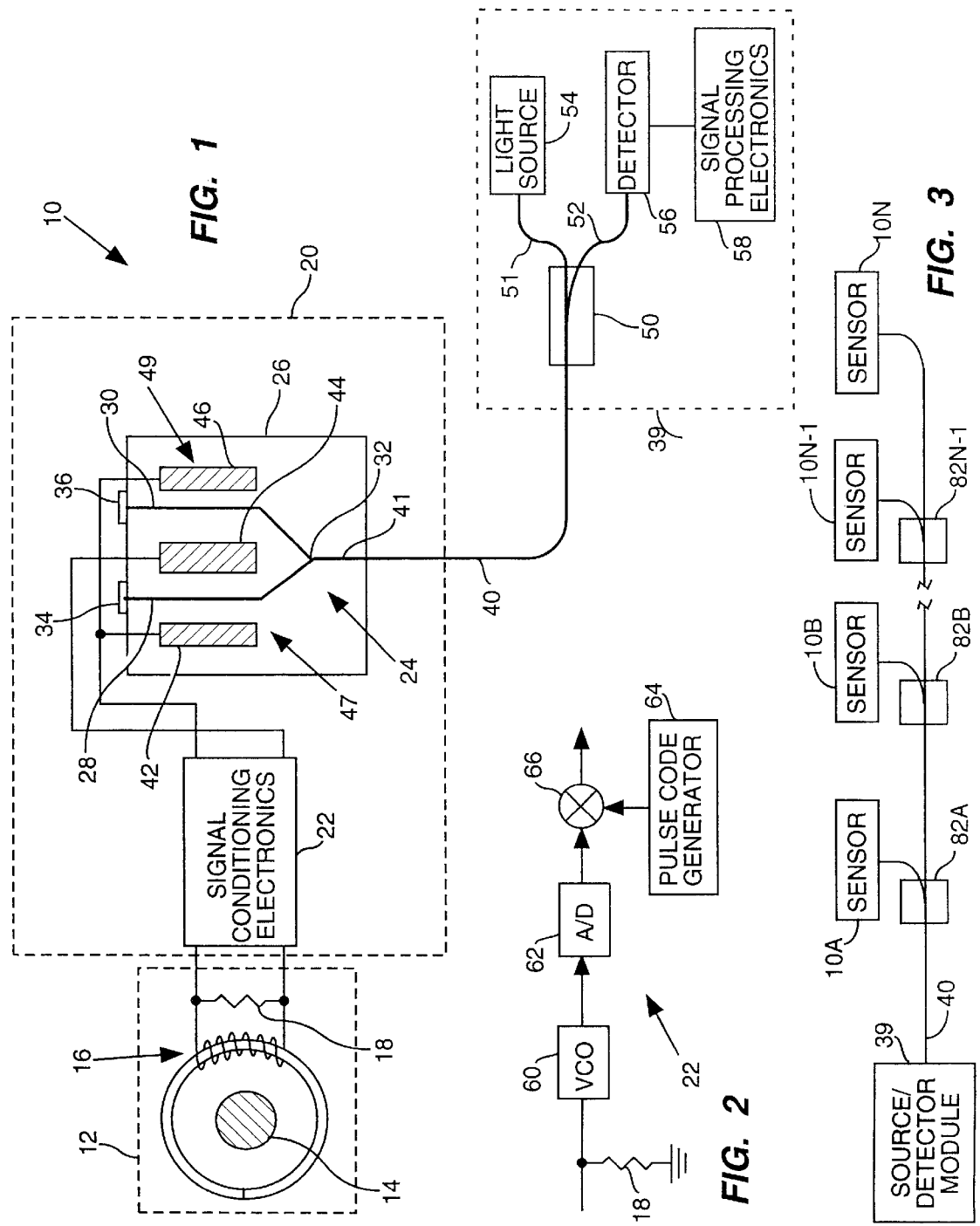

REMOTE SENSOR WITH WAVEGUIDE OPTICS TELEMETRY

BACKGROUND OF THE INVENTION

This invention relates generally to remote measurement of electrical current. More particularly, this invention relates to techniques for measuring electrical current at a one location and using optical signals output from an interferometer to signals indicative of the electrical current to another location for processing.

Prior art for sensing electrical current with optical telemetry includes utilizing a step-down transformer connected to a fiber-wrapped PZT phase modulator through a resistor, with the fiber comprising one leg of a fiber optic Michelson interferometer. Prior art also includes use of Bragg gratings, in changing the spectrum of light telemetered light from the current sensor, as well as fiber optic sensors that make use of the Faraday effect, which change the polarization state of light propagating through an optical fiber in proportion to a magnetic field. These methods tend to be costly to implement and environmentally sensitive, especially when the interferometer is comprised of optical fiber.

SUMMARY OF THE INVENTION

This invention provides a novel method for remote measurement of a quantity such as electrical current. The present invention provides a low cost, stable solution to the problem of high accuracy current sensing over large distances, with a large number of sensors. It integrates an innovative approach to voltage-to-optical phase conversion with existing technology for current-to-voltage conversion, as well as telemetry and signal processing suitable for high channel count. It allows a single chip interferometer with zero pathlength mismatch between interferometer branches to be used with a low cost source and detection approach for high channel counts. Additionally, the signal processing approach affords minimal environmental, thermal and vibration sensitivity.

A system for measuring electrical current flowing in an electrical conductor comprising a signal source/detection module and a telemetry optical fiber having a first end optically coupled to the signal source/detection module. A conversion module is optically coupled to a second end of the telemetry optical fiber. The conversion module includes an interferometer having a pair of optical paths and an optical waveguide arranged to be included in one of the optical paths of the interferometer. The interferometer is arranged to produce an interference pattern to indicate the phase relationship of optical signals input to the pair of optical paths from the signal source/detection module. The system also includes apparatus arranged to phase modulate optical signals guided by the optical waveguide and an electrical current sensor connected to the phase modulating apparatus and arranged to provide a modulating signal to the phase modulating apparatus such that the interference pattern indicates the magnitude of the electrical current.

The electrical current sensor head produces a voltage having a magnitude that is proportional to the electrical current amplitude. The conversion module includes apparatus for producing an encoded digital signal that indicates the magnitude of the electrical current.

The interferometer preferably includes an integrated optics substrate with the pair of optical paths of the interferometer formed on the substrate. The phase modulating apparatus preferably includes a pattern of electrodes formed on the integrated optics substrate and arranged in relation to the optical paths so that application of an electrical signal to the electrodes produces a corresponding phase difference between optical signals traversing the optical paths of the interferometer.

An appreciation of the objectives of the present invention and a more complete understanding of its structure and method of operation may be had by studying the following description of the preferred embodiment and by referring to the accompanying drawings.

BRIEF DESCRIPTION OF THE DRAWINGS

FIG. 1 is a block diagram of a remote current sensor system according to the present invention;

FIG. 2 is a circuit diagram of signal conditioning apparatus that may be included in the apparatus of FIG. 1; and FIG. 3 illustrates a plurality of sensors according to FIG. 1 arranged in an array.

DESCRIPTION OF THE PREFERRED EMBODIMENT

This disclosure describes an apparatus and a method for remote current sensing. Specific details are disclosed to provide a thorough description of the invention. However, it will be apparent that the present invention may be practiced without these specific details. Well-known components of the present invention are shown in block diagram form, rather than in detail, to avoid unnecessarily obscuring the invention.

FIG. 1 illustrates a remote current sensing system 10 that includes a sensor head 12 that includes a clamp-on current sensor 16 arranged to sense the electrical current in an electrically conductive cable 14. The current sensor 12 preferably utilizes the technology of a standard step-down transformer-type clamp-on current detector 16 with an electrical resistor 18 for providing an appropriate voltage output proportional to the magnitude of the measured current. The signal output by the current sensor 12 is then input to a conversion module 20.

The conversion module 20 includes signal conditioning electronics 22 and an integrated optics interferometer 24. The integrated optics interferometer 24 may be either a Mach-Zehnder interferometer or a Michelson interferometer. The illustrated embodiment has a Michelson interferometer formed on a substrate 26 in the form of a pair of optical waveguides 28 and 30 connected by a Y-junction 32. The Michelson interferometer may be formed in a single chip of lithium niobate (or other suitable waveguide substrate with a large electro-optic coefficient, for example, proton exchange waveguide or titanium indifused waveguide with linear polarizer). The waveguide device linearly polarizes light propagating through the chip.

Reflectors 34 and 36 are arranged at ends of the optical waveguides 28 and 30, respectively, to complete the Michelson interferometer architecture. Optical signals are input to the interferometer 24 via a telemetry optical fiber 40 that extends between the conversion module 20 and a source/detection module 39. The telemetry fiber 40 is preferably formed of single mode optical fiber. The optical fiber 40 is butt-coupled to an optical waveguide 41 that extends to the Y-junction 32.

A Mach-Zehnder interferometer could be formed by forming a second Y-junction (not shown) between the ends of the optical waveguides instead of the reflectors 34 and 36.

A plurality of phase modulator electrodes 42, 44 and 46 are formed on the substrate 26. The electrodes 42 and 44 are arranged to be on opposite sides of the optical waveguide 30. The optical waveguide 28 is between the electrodes 44 and 46. The electrodes 42 and 44 form a phase modulator 47 for light guided by the optical waveguide 28. Similarly, the electrodes 44 and 46 form a phase modulator 49 for light guided by the optical waveguide 30.

An optical fiber coupler 50 is arranged to couple light between an optical fiber 51 and the optical fiber 40. The optical fiber 51 receives light from an optical signal source 54. Light that passes through the optical coupler 50 is guided in the optical fiber 40 to the optical waveguide 41 for input to the interferometer 24. The input light propagates to the Y-junction 32, which acts as a beam splitter.

In the Michelson interferometer configuration the input optical signals propagate to the reflectors 34 and 36 and then back to the Y-junction 32 where they combine coherently and form the output intensity signal of the interferometer 24. The signal output of the interferometer 24 is an interference pattern that indicates the phase relationship of the optical signals guided by the optical waveguides 28 and 30, which is proportional to the voltage applied to the electrodes 42, 44 and 46.

The signal conditioning electronics 22 conditions the current sensor output to allow multiplexing of signals from multiple sensors. The electronics used to condition the voltage signal may be powered by tapping some of the sensed current, by way of a voltage across a resistor and by appropriate voltage rectification, regulation/filtering.

Referring to FIG. 2, the signal conditioning electronics includes a voltage-controlled oscillator (VCO) 60 connected to the resistor 18. The VCO 60 produces an oscillatory signal having frequency proportional to the voltage across the resistor 18. An analog-to-digital converter (ADC) 62 is arranged to digitize the signal output from the VCO 60. A pulse code generator 64 and the ADC 60 are connected to a mixer 66 that is in turn connected to the phase modulators 47 and 49. The pulse code generator 64 is arranged to superimpose a coded pulse on the digitized signal that indicates the sensor voltage.

The signal conditioning electronics 18 is then connected to the pair of phase modulators 47 and 49 that are arranged to modulate the phase of optical signals guided by the optical waveguides 28 and 30. The output of the signal conditioning electronics 22 is connected to the phase modulators 47 and 49 to operate them in push-pull to induce a phase shift of opposite sign for each optical path in the interference 24. Push-pull operation of the phase modulators 47 and 49 allows an effective doubling of the transfer function that would result if phase modulation were applied to only one of the optical waveguides 28 or 30. Push-pull operation also allows nonlinearities in the phase modulators 47 and 49 to be rejected as common mode.

Thus applying the output of the signal conditioning electronics 22 to the phase modulators 47 and 48 modulates the optical signals guided by the optical waveguides 28 and 30 by the digital signal that indicates the magnitude of the electrical current in the cable 14. This modulation converts the voltage indicative of the sensed current to an optical phase change.

Signals output from the integrated optics interferometer 24 are input to the telemetry optical fiber 40, which guides the signals to the source/detection module 39. The optical fiber coupler 50 couples part of the signals into the optical fiber 52, which guides the signals to a photodetector 56. The photodetector 56 produces an electrical signal that indicates the optical intensity in the interference pattern. Signal processing electronics 58 then receives the electrical signals from the photodetector 56 and determines the magnitude of the electrical current.

FIG. 3 illustrates an array 80 of current sensors 10A, 10B..., 10N of the configuration of FIG. 1 that are optically coupled to the source/detection module 39 via the telemetry fiber 40. The current sensors 10A, 10B..., 10N are coupled to the telemetry fiber 40 via corresponding optical couplers 82A, 82B,..., 82N-1. The current sensors 10A, 10B..., 10N may be essentially identical except that each has a unique pulse code, which enables the signal processing electronics 58 to distinguish the pulse encoded signal for a particular sensor.

The digital signal that indicates the magnitude of the electrical current can be modulated in a number of different fashions, for example, AM, FM, pulse code multiple access, subcarrier modulation, etc. Each has advantages and drawbacks for allowing high input bandwidth up to 20 kHz and multiplexing with signals from other sensors at low cost. The frequency and pulse code modulation techniques allow the applied signal to be sensed accurately despite small variations in the phase modulator modulation constant (due to temperature, vibration effects, etc.), as long as minimum and maximum voltage level thresholds are met.

Demultiplexing/demodulation can be done in different ways, depending upon the modulation/multiplexing scheme and the bandwidth needed for the output needed. The optical source 54 can be a short coherence length laser diode, with provision for launching unpolarized light. The optical signal source 54 can alternatively be comprised of a double-pass broadband fiber source (laser diode, WDM, erbium-doped fiber with a mirrored free end and isolators) and a Lyot depolarizer to avoid polarization fading effects. A doped fiber optical amplifier (not shown) can be added following a broadband fiber source to increase the optical source power to allow higher channel counts or longer telemetry distances.

The invention is a significant improvement over the prior art. A combination of well-developed technology for hand-held current meters, Michelson interferometer-on-a-chip technology with local phase modulation after signal conditioning, including appropriate modulation (using electronics that tap power from the measured power line), low cost source, telemetry and detection schemes is utilized. Temperature and vibration (or pressure) acting on the waveguide structure do not affect operation, since they only affect modulation amplitude instead of frequency. Because the sensed current has been converted to frequency information in an optical signal, the quantity of interest is frequency, not amplitude information, and is unaffected by these environments. With a small array of optical power sources, a large array of sensors can easily be remotely monitored tens of kilometers from the source/detection hardware. The approach can be easily adapted to a wide range of sensed current applications, with high bandwidth amplitude or spectral content outputs.

Although the invention is described with reference to an electrical current sensor, the invention is not limited to electrical current sensing. Any other type of sensor that produces a voltage proportional to a measured quantity may be multiplexed using the conversion module 20 and the source/detector module according to the present invention.

The structures and methods disclosed herein illustrate the principles of the present invention. The invention may be embodied in other specific forms without departing from its spirit or essential characteristics. The described embodiments are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

What is claimed is:

1. A system for measuring electrical current flowing in an electrical conductor, comprising:

a signal source/detection module;

a telemetry optical fiber having a first end optically coupled to the signal source/detection module;

a conversion module optically coupled to a second end of the telemetry optical fiber, the conversion module including an interferometer having a pair of optical paths and an optical waveguide arranged to be included in each one of the optical paths of the interferometer, the interferometer being arranged to produce an interference pattern to indicate the phase relationship of optical signals input to the pair of optical paths from the signal source/detection module;

an apparatus arranged to phase modulate optical signals guided by the optical waveguide; and an electrical current sensor connected to the phase modulating apparatus and arranged to provide a modulating signal to the phase modulating apparatus such that the interference pattern indicates the magnitude of the electrical current.

2. The system of claim 1 wherein the electrical current sensor produces a voltage having a magnitude that is proportional to the electrical current and wherein the conversion module includes apparatus for producing an encoded digital signal that indicates the magnitude of the electrical current.

3. The system of claim 2 wherein the interferometer includes an integrated optics substrate with the pair of optical paths of the interferometer being formed on the substrate and the phase modulating apparatus includes a pattern of electrodes formed on the integrated optics substrate and arranged in relation to the optical paths so that application of an electrical signal to the electrodes produces a corresponding phase difference between optical signals traversing the optical paths of the interferometer.

4. A measuring system, comprising:

a signal source/detection module;

a telemetry optical fiber having a first end optically coupled to the signal source/detection module;

a conversion module optically coupled to a second end of the telemetry optical fiber, the conversion module including an interferometer having a pair of optical paths and an optical waveguide arranged to be included in each one of the optical paths of the interferometer, the interferometer being arranged to produce an interference pattern to indicate the phase relationship of optical signals input to the pair of optical paths from the signal source/detection module;

an apparatus arranged to phase modulate optical signals guided by the optical waveguide; and a sensor head that produces a voltage proportional to a quantity being measured connected to the phase modulating apparatus and arranged to provide a modulating signal to the phase modulating apparatus such that the interference pattern indicates the magnitude of the measured quantity.

5. The system of claim 4 wherein the conversion module includes apparatus for producing an encoded digital signal that indicates the magnitude of quantity being measured.

6. The system of claim 5 wherein the interferometer includes an integrated optics substrate with the pair of optical paths of the interferometer being formed on the substrate and the phase modulating apparatus includes a pattern of electrodes formed on the integrated optics substrate and arranged in relation to the optical paths so that application of an electrical signal to the electrodes produces a corresponding phase difference between optical signals traversing the optical paths of the interferometer.

* * * * *